United States Patent
Chien-Chih et al.

(10) Patent No.: US 6,617,680 B2
(45) Date of Patent: Sep. 9, 2003

(54) CHIP CARRIER, SEMICONDUCTOR PACKAGE AND FABRICATING METHOD THEREOF

(75) Inventors: Chen Chien-Chih, Kaohsiung (TW); Yu-Ting Lai, Taichung (TW); Chin-Wen Lai, Taichung (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 09/935,312

(22) Filed: Aug. 22, 2001

(65) Prior Publication Data

US 2003/0038351 A1 Feb. 27, 2003

(51) Int. Cl.⁷ .............................................. H01L 23/04
(52) U.S. Cl. ................... 257/698; 257/683; 257/684; 257/676; 257/678; 257/698; 257/777; 257/779; 257/780; 257/781; 257/782; 257/785; 257/786; 257/691; 257/787; 438/112; 438/124; 438/125; 438/126; 438/127; 174/260; 174/261; 361/767; 361/777; 361/783; 264/17; 264/272; 29/25.01
(58) Field of Search .......................... 257/684, 678, 257/676, 777, 779, 780, 781, 782, 785, 786, 683, 698; 438/612, 617, 110, 112, 124, 125, 126, 127

(56) References Cited

U.S. PATENT DOCUMENTS

| | | | | |
|---|---|---|---|---|
| 4,231,987 A | * | 11/1980 | Osawa et al. | 264/328.1 |
| 4,825,284 A | * | 4/1989 | Soga et al. | 357/80 |
| 4,915,608 A | * | 4/1990 | Tsutsumi et al. | 425/121 |
| 5,074,779 A | * | 12/1991 | Tsutsumi et al. | 425/444 |
| 5,222,014 A | * | 6/1993 | Lin | 361/414 |
| 5,291,062 A | * | 3/1994 | Higgins et al. | 257/698 |
| 5,311,402 A | * | 5/1994 | Kobayashi | 361/760 |
| 5,375,989 A | * | 12/1994 | Tsutsumi | 425/127 |
| 5,450,283 A | | 9/1995 | Lin et al. | |
| 5,635,671 A | * | 6/1997 | Freyman et al. | 174/52.2 |
| 5,801,440 A | * | 9/1998 | Chu et al. | 257/691 |
| 5,818,698 A | * | 10/1998 | Corisis | 361/760 |
| 6,150,193 A | * | 11/2000 | Glenn | 438/113 |
| 6,208,525 B1 | * | 3/2001 | Imasu et al. | 361/783 |
| 6,214,645 B1 | | 4/2001 | Kim | |
| 6,246,015 B1 | * | 6/2001 | Kim | 174/261 |
| 6,437,432 B2 | * | 8/2002 | Ikumo et al. | 257/691 |
| 6,458,629 B2 | * | 10/2002 | Kobayashi | 438/127 |
| 6,469,258 B1 | * | 10/2002 | Lee et al. | 174/261 |
| 6,473,311 B1 | * | 10/2002 | James et al. | 361/777 |

* cited by examiner

*Primary Examiner*—Sheila V. Clark
*Assistant Examiner*—Edgardo Ortiz
(74) *Attorney, Agent, or Firm*—Peter F. Corless; Steven M. Jensen; Edwards & Angell, LLP

(57) ABSTRACT

A chip carrier, a semiconductor package and a fabricating method thereof are proposed, in which on one side of the chip carrier finally removed from an engaged surface of a mold in a de-molding process there is formed at least one grounding means corresponding in position to an eject pin of the mold, so as to allow a gear amount of electrical static generated on a surface of the semiconductor package during molding and de-molding to be discharged to the outside, instead of being retained on a semiconductor chip, conductive elements and conductive traces of the semiconductor package. This therefore can prevent electrical leakage and damage to the semiconductor chip from occurrence, and improve the quality and production efficiency for the semiconductor package.

14 Claims, 6 Drawing Sheets

US 6,617,680 B2

CHIP CARRIER, SEMICONDUCTOR PACKAGE AND FABRICATING METHOD THEREOF

FIELD OF THE INVENTION

This invention relates to chip carriers, semiconductor packages and fabricating methods of the semiconductor packages, and more particularly, to a chip carrier, a semiconductor package and a fabricating method of the semiconductor package, in which electrical static produced on a surface of the semiconductor package is discharged to outside of the semiconductor package.

BACKGROUND OF THE INVENTION

It is desired for semiconductor packages to be provided with I/O connections in higher density, in an effort to improve electrical and operational performance for electronic products. Therefore, a BGA semiconductor package employs a plurality of array-arranged solder balls for electrically connecting a semiconductor chip to external devices, so as to desirably increase the I/O connections for allowing the BGA semiconductor package to be a mainstream product.

Generally, as shown in FIG. 8, a BGA semiconductor package 1 substantially comprises a chip carrier 10 having a first side and a second side opposing the first side, a semiconductor chip 40 mounted on the first side of the chip carrier 10, a plurality of conductive elements 50 such as metallic bonding wires for electrically connecting the semiconductor chip 40 to the chip carrier 10, an encapsulant 70 formed of a molding compound such as epoxy resin for encapsulating the semiconductor chip 40 and the conductive elements 50 on the first side of the chip carrier 10; and a plurality of solder balls 80 implanted on the second side of the chip carrier 10 for electrically connecting the semiconductor chip 40 to external devices.

The chip carrier 10 is commonly made of a material such as BT (bismaleimide triazine) resin, and includes a base layer 11 having a first surface and a second surface opposing the first surface. On the first surface of the base layer 11 there are formed a die pad 16 for mounting the semiconductor chip 40 thereon and a plurality of conductive traces 12 electrically connected to the semiconductor chip 40. On the second surface of the base layer 11 there are disposed a plurality of ball pads 14 for implanting solder balls 80 thereon, while the ball pads 14 are electrically connected to the conductive traces 12 by a plurality of vias 13 formed through the base layer 11. A solder mask layer 15 is formed on each of the first and second surfaces of the base layer 11, in a manner that part of the conductive traces 12 electrically connected to the semiconductor chip 40 on the first surface and the ball pads 14 on the second surface are respectively expose to outside of the solder mask layer 15, so as to prevent the conductive traces 12 from coming into contact with one another for eliminating the occurrence of short circuit, and protect the conductive traces 12 against external detrimental factors.

The BGA semiconductor package 1 is fabricated by the steps as follows: preparing a chip carrier as the one described above; performing a die bonding process for mounting at least one semiconductor chip on a die pad formed on a first side of the chip carrier; providing a plurality of conductive elements for electrically connecting the semiconductor chip to the chip carrier; performing a molding process for forming an encapsulant, which encapsulated the semiconductor chip and the conductive elements on the first side of the chip carrier; performing a de-molding process for ejecting the semi-fabricated semiconductor package form a mold used in the molding process by eject pins formed on the mold; performing a ball implanting process for implanting a plurality of solder balls on ball pads formed on a second side of the chip carrier; and performing a singulating process for forming individual fabricated semiconductor packages.

U.S. Pat. No. 5,450,283 discloses a mold 100, which can be used in the foregoing molding and de-molding processes, as shown in FIG. 4. The mold 100 includes a top mold 110 and a bottom mold 120 engaged with the top mold 110, wherein plurality of eject pins 111, 121 respectively hang bias means 112, 122 such as spiral springs are formed on the top and bottom molds 110, 120. Further, on an engaged surface of the top mold 110 there is formed a molding cavity 113, while on an engaged surface of the bottom mold 120 there is formed a plurality of pilot pins 123 for positioning a chip carrier.

FIGS. 4A–4D illustrate the steps involved in using the conventional mold 100 in the foregoing molding and de-molding processes. After completing the die bonding and electrically connecting processes, the semi-fabricated semiconductor package 1A is horizontally placed on the engaged surface of the bottom mold 120, in a manner that a plurality of pilot holes 18 preformed on the chip carrier 10 are coupled to the pilot pins 123 of the bottom mold 120, for positioning the chip carrier 10 on the engaged surface of the bottom mold 120. Then, the top mold 110 is engaged with the bottom mold 120 for performing the molding process, so as to form the encapsulant 70 for encapsulating the semiconductor chip and the conductive elements on the first side of the chip carrier 10, as shown in FIG. 4B.

Then, the de-molding process is performed for ejecting the semiconductor package 1A from the mold 100. As shown in FIG. 4C, first, the top mold 110 is moved upwardly, so as to eject the semi-fabricated semiconductor package IA after molding from the molding cavity 113 of the top bottom 110 by resilient force of the bias means 112, while the eject pins 111 of the top mold 110 are maintained in position, and the semi-fabricated semiconductor package IA are retained on the engaged surface of the bottom mold 120

Moreover, as shown in FIG. 4D, the bottom mold 120 is moved downwardly to an end position, where the eject pins 121 counteract bias force of the bias means 122 and protrude from the engaged surface of the bottom mold 120, so as to eject the semi-fabricated semiconductor package 10A from the engaged surface of the bottom mold 120, and remove the semi-fabricated semiconductor package IA from the mold 100.

In the molding process, a molding compound used for forming the encapsulant 70 is injected to the molding cavity 113 of the mold 100, and a large amount of electrical static is produced due to friction between mold flow of the molding compound and a solder mask layer 15 on the chip carrier 10 disposed on the engaged surface of the bottom mold 120. Similarly, in the de-molding process, electrical static is also generated at a great amount during ejecting the semi-fabricated semiconductor package 1A from the mold 100. However, as the solder mask layer 15 on the chip carrier 10 and the encapsulant 70 are both made of electrical insulative materials, the electrical static can not be transmitted therethrough to the mold 100 to be discharged to outside of the mold 100. Therefore, the electrical static is retained on the semiconductor chip, the conductive elements or the conductive traces of the semi-fabricated semiconductor package 1A. This seriously damages the package, and tends to cause electrical leakage, as well as deteriorates the quality of the package.

Accordingly, U.S. Pat. No. 6,214,645 discloses a mold and a chip carrier for preventing electrical static from being retained therein, as shown in FIGS. 5–7. In a first embodiment of the chip carrier, besides a solder mask layer 15, on a second side of the chip carrier 10 disposed on an engaged surface of a bottom mold 120 there is formed a metallic protrusion 20 to be used as a grounding means, for being electrically connected to the engaged surface of the bottom mold 120, so as to allow the electrical static to be discharged through the metallic protrusion 20 and the bottom mold 120 to the outside in a molding process, as shown in FIG. 5.

In a second embodiment of the chip carrier, as shown in FIG. 6, on an inside wall of a pilot hole 18 disposed in the chip carrier 10 there is formed by a conventional technique, such as electrically plating, a metal layer 23 to be used as a grounding means. In the molding process, the metal layer 23 is electrically connected to a pilot pin 123 on the engaged surface of the bottom mold 120 for allowing the electrical static to be discharged to the outside through the metal layer 23 and the bottom mold 120.

In a third embodiment of the mold, as shown in FIG. 7, on a runner 32 of a top mold 110 there protrudes a protrusion 35 to be used as a grounding means. In the molding process, the protrusion 35 is electrically connected to a metallic runner 17 on the chip carrier 10, so as to allow the electrical static to be discharged to the outside through the protrusion 35 and the top mold 110.

In practice, by determining a value of the electrical static produced in the semiconductor package IA during molding and de-molding, it is observed that the electrical static, generated due to the friction between the mold flow of the molding compound and the solder mask layer 15 on the chip carrier 10, is discharged through the grounding means such as the metallic protrusion 20, the metal layer 23 and the protrusion 35 and then through the mold 100 to the outside.

However, during de-molding, as shown in FIG. 4C, as the top mold 110 is moved upwardly for ejecting the semiconductor package 1A from the molding cavity 113 of the top mold, the protrusion 35 protruding from the top mold 110 in the foregoing embodiment of the mold is disconnected from the metallic runner 17 of the chip carrier 10, and thus can not function as the grounding means. Accordingly, the electrically static subsequently produced during ejecting the semiconductor package 1A from the bottom mold 120 can not be transmitted to the mold 100 and discharged through the mold 100 to the outside, whereas the electrically static is retained on the semiconductor chip, the conductive elements or the conductive traces in the semiconductor package 1A. Moreover, the chip carrier various in dimension and type has the metallic runner variably formed in shape and position, and accordingly the top mold having the corresponding protrusion is needed, which increases the fabrication cost for the semiconductor package. Further, the correspondingly-dimensioned mold has to be employed during molding, which increases the fabrication time and reduces the production efficiency.

In addition, in the foregoing first embodiment of the chip carrier, the metallic protrusion 20 keeps in electrical connection with the engaged surface of the bottom mold 120 during ejecting the semiconductor package 1A from the top mold 110; however, the metallic protrusion 20 is disconnected from the bottom mold 120 and can not act as the grounding means when the bottom mold 120 is moved downwardly for ejecting the semiconductor package 1A from the engaged surface of the bottom mold 20 by using the eject pins 121 on the bottom mold 120, as shown in FIG. 4D. Therefore, the electrically static generated during ejecting the semiconductor package 1A from the bottom mold 120 can not be transmitted and discharged through the mold 100 to the outside, nevertheless, the electrically static is retained on the semiconductor chip, the conductive elements or the conductive traces in the semiconductor package 1A. Furthermore, the formation of the metallic protrusion 20 as the grounding means on the chip carrier 10 also increases the complexity and cost in fabrication in this embodiment of the chip carrier.

Similarly, in the foregoing second embodiment of the chip carrier, the metal layer 23 formed as the grounding means on the inside wall of the pilot hole 18 keeps in electrical connection with the pilot pin 123 of the bottom mold 120 during ejecting the semiconductor package 1A from the top mold 110; however, the metal layer 23 is disconnected from the pilot pin 123 and can not further function as the grounding means when the bottom mold 120 is moved downwardly for ejecting the semiconductor package IA from the engaged surface of the bottom mold 120 by using the eject pins 121 on the bottom mold 120, as shown in FIG. 4D. This makes the electrically static generated during ejecting the semiconductor package 1A from the bottom mold 120 retained on the semiconductor chip, the conductive elements or the conductive traces in the semiconductor package 1A, instead of being transmitted and discharged to the outside through the mold 100. Moreover, the pilot hole is generally constructed with positioning accuracy, for example, around 1.5±0.05 mm, so as to control deviation in position for the encapsulant within 0.05 mm. However, the formation of the metal layer 23 on the inside wall of the pilot hole 18 makes the positioning accuracy for the pilot hole become 1.5±0.1 mm, which then increases the deviation for the encapsulant in position and accordingly degrades the quality of the semiconductor package.

SUMMARY OF THE INVENTION

A primary objective of the present invention is to provide a chip carrier, a semiconductor package and a fabricating method thereon in which, in a molding and a de-molding processes, electrical static generated on a surface of the semiconductor package is not retained on a semiconductor chip, conductive elements or conductive traces in the semiconductor package, without constructing a metallic protrusion on the chip carrier, a metal layer on an inside wall of a pilot hole of the chip carrier, or a protrusion on a runner of a mold.

In accordance with the above and other objectives, the present invention proposes a chip car, including, a first side, a second side opposing the first side and removed finally from an engaged surface of a mold in a de-molding process; and at least one grounding means formed on the second side corresponding in position to eject pins of the mold.

The invention proposes a semiconductor package, comprising: a chip carrier having a first side and a second side opposing the first side; a semiconductor chip deposited on e first side of the chip carrier; a plurality of conductive elements such as metallic wires for electrically connecting the semiconductor chip to the chip carrier; an encapsulant formed of a molding compound such as epoxy resin for encapsulating the semiconductor chip and the conductive elements on the first side of the chip carrier; and a plurality of solder balls implanted on the second side of the chip carrier for electrically connecting the semiconductor chip to external devices, wherein on one of the sides of the chip carrier finally removed from an engaged surface of a mold in a de-molding process there is formed at lest one grounding means corresponding in position to eject pins of the mold.

A fabricating method of a semiconductor package proposed in the invention comprises the steps of: preparing a chip carrier having a first side and a second side opposing the first side, wherein on one of the sides of the chip carrier finally removed from an engaged surface of a mold in a de-molding process there is formed at least one grounding means corresponding in position to eject pins of the mold; performing a die bonding process for mounting at least one semiconductor chip on the first side of the chip carrier, providing a plurality of conductive elements for electrically connecting the semiconductor chip to the chip carrier; performing a molding process for forming an encapsulant for encapsulating the semiconductor chip and the conductive elements on the first side of the chip carrier; performing a de-molding process for ejecting the semi-fabricated semiconductor package from the mold by using the eject pins on the mold; performing a ball implanting process for implanting a plurality of solder balls at ball pads on the second side of the chip carrier; and performing a singulating process for forming individual fabricated semiconductor packages.

In this case, in the molding and de-molding processes, the grounding means formed on the chip carrier allows electrical static produced on a surface of the semi-fabricated semiconductor package to be effectively discharged through the mold to outside of the semiconductor package, instead of being retained on the semiconductor chip, the conductive elements or the conductive traces. This further prevents electrical leakage or damage to the semiconductor chip from occurrence, and also greatly improves the quality and production efficiency for the semiconductor package.

BRIEF DESCRIPTION OF THE DRAWINGS

The invention can be more fully understood by reading the following detailed description of the preferred embodiments, with reference made to accompanying drawings, wherein.

DETAILED DESCRIPTION OF THE PREFERRED EMBODIMENT

Figure 1A:
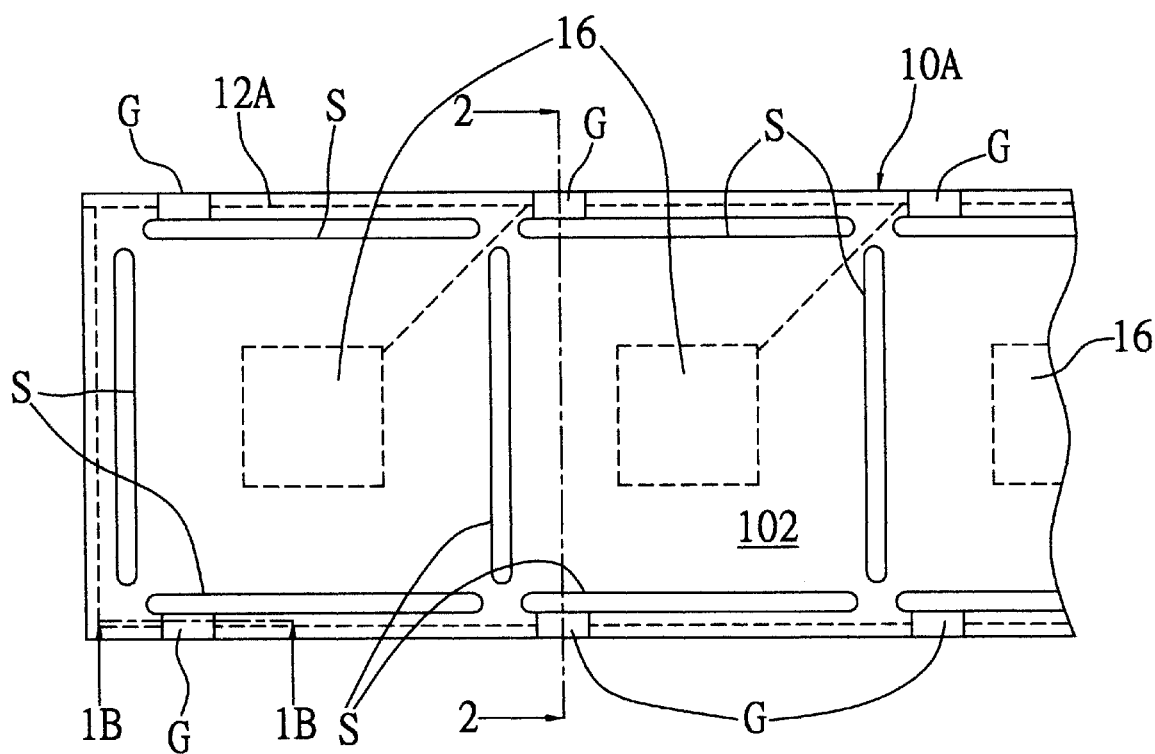
FIG. 1A is a bottom view of a preferred embodiment of the chip carrier of the invention.
Figure 1B:
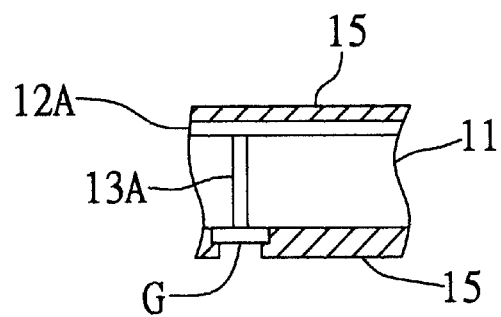
FIG. 1B is a sectional view of FIG. 1A cutting along the line 1B—1B.

As shown in FIGS. 1A and 1B, a chip carrier 10A proposed in the invention includes: a first side 101; a second side 102 opposing the first side and removed finally from an engaged surface of a mold in a de-molding process; and at least one grounding means G formed on the second side 102 corresponding in position to eject pins of the mold.

Figure 8:
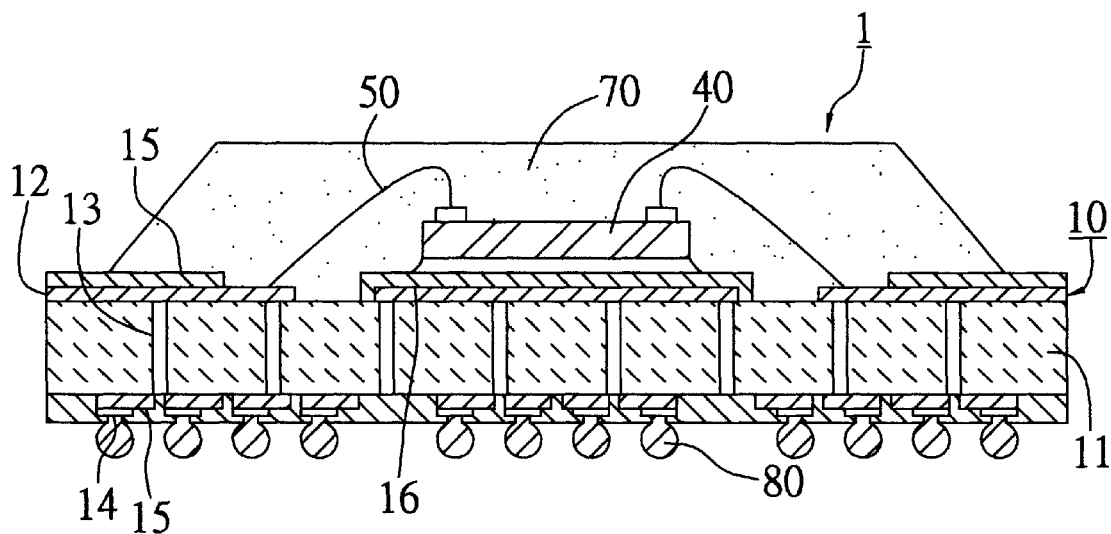
FIG. 8 (PRIOR ART) is a schematic diagram of a BGA conventional semiconductor package.

The chip carrier 10A can be conducted in a same manner as a conventional chip carrier 10 shown in FIG. 8, comprising a base layer 11 made of a material such as BT resin and having a first surface and a second surface opposing the first surface. On the first surface of the base layer 11 there are formed a die pad 16 for mounting a semiconductor chip 40 thereon and a plurality of conductive traces 12 electrically connected to the semiconductor chip 40. On the second surface of the base layer 11 there are disposed a plurality of ball pads 14 for implanting solder balls 80 thereon, while the ball pads 14 are electrically connected to the conductive traces 12 by a plurality of vias 13 formed through the base layer 11. Solder mask layers 15 are respectively formed on the first surface and second surface of the base layer 11, in a manner that part of the conductive traces 12 electrically connected to the semiconductor chip 40 on the first surface and the ball pads 14 on the second surface are exposed to outside of the solder mask layers 15, so as to prevent the conductive traces 12 from coming into contact with one another eliminating the occurrence short circuit, and protect conductive traces 12 against external detrimental factors. In addition cutting lines are provided on the chip carrier 10A for a means to cut therethrough so as to form individual semiconductor packages in a singulating process, as shown in FIGS. 1A and 2.

Moreover, as shown in FIGS. 1A and 1B, the ground means G is commonly formed by plating a conductive material such as gold or copper in a manner as to be exposed to the outside of solder mask layer 15. Further, a grounding vias 13A is formed through the chip carrier 10A for electrically connecting the grounding means G to a grounding trace 12A formed on the first side 101 of the chip carrier 10A, while the grounding trace 12A is generally connected to the die pad 16 on the first side 101 of the chip carrier 10A.

Figure 2:
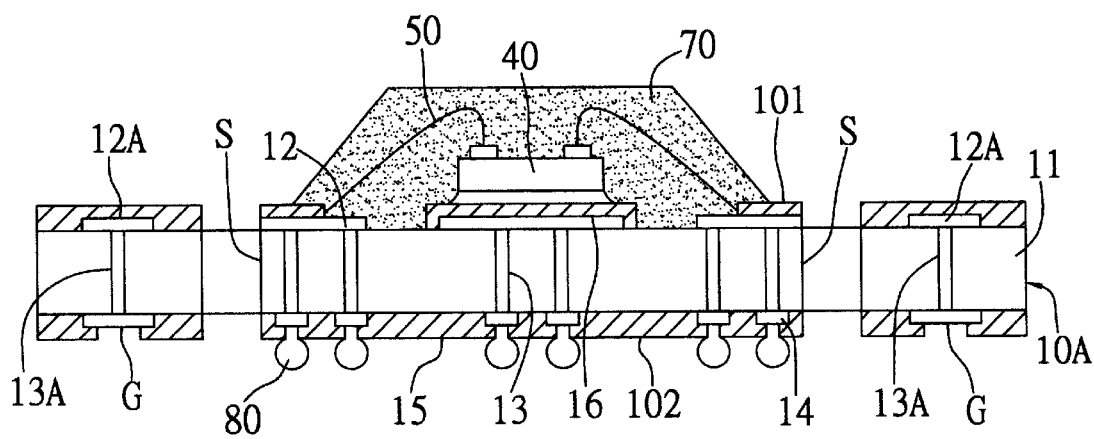
FIG. 2 is a sectional view of FIG. 1A cutting along the line 2—2 showing a preferred embodiment of the semiconductor package of the invention prior to a singulating process.

As shown in FIG. 2, a semiconductor package proposed in the invention comprises: a chip carrier 10A as the one described above; a semiconductor chip 40 mounted on a first side 101 of the chip carrier 10A; a plurality of conductive elements 50 such as metallic wires for electrically connecting the semiconductor chip 40 to the chip carrier 10A; an encapsulant 70 formed of a compound such as epoxy resin for encapsulating the semiconductor chip 40 and the conductive elements 50 on the first side 101 of the chip carrier 10A; and a plurality of solder balls 80 implanted on a second side 102 of the chip carrier 10A for electrically connecting the semiconductor chip 40 to external devices.

Figure 4A:
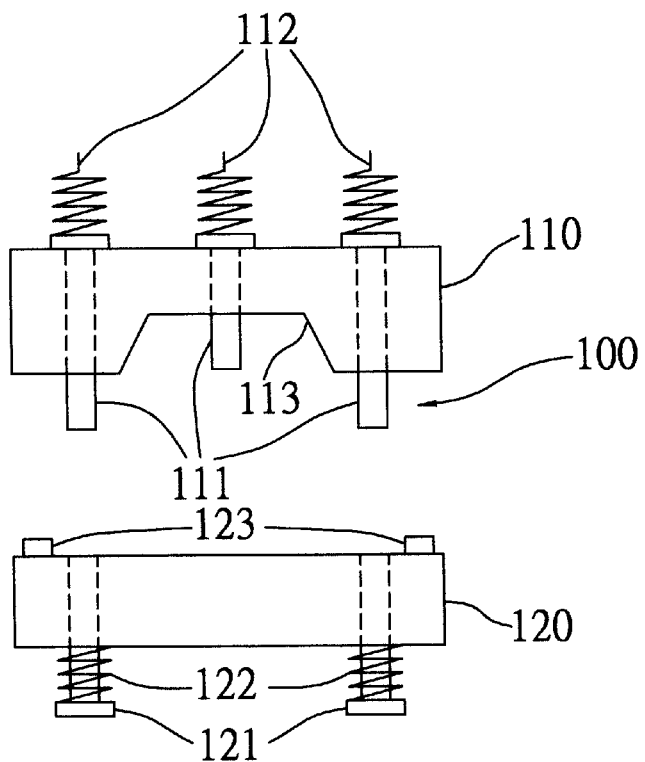
FIGS. 4A–4D (PRIOR ART) are schematic diagrams showing the steps involved using a conventional mold for performing a molding and a de-molding process.
Figure 4B:
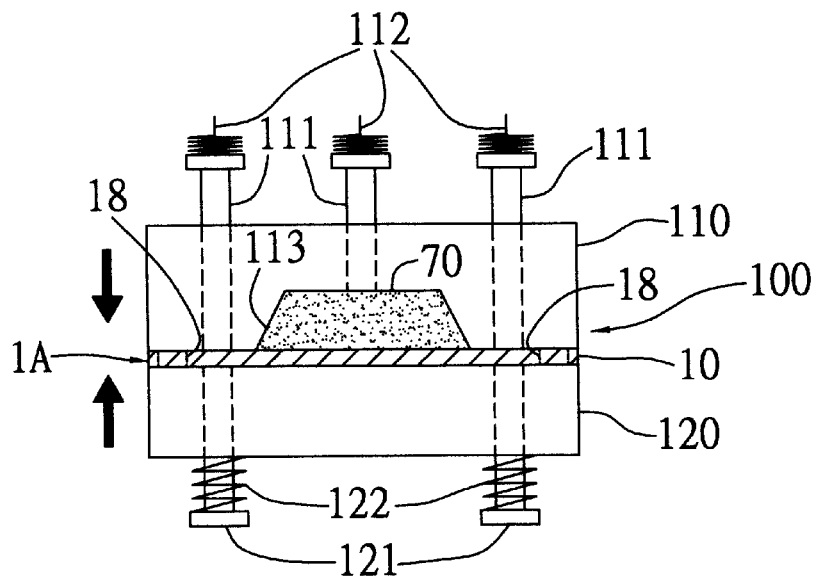
Figure 4C:
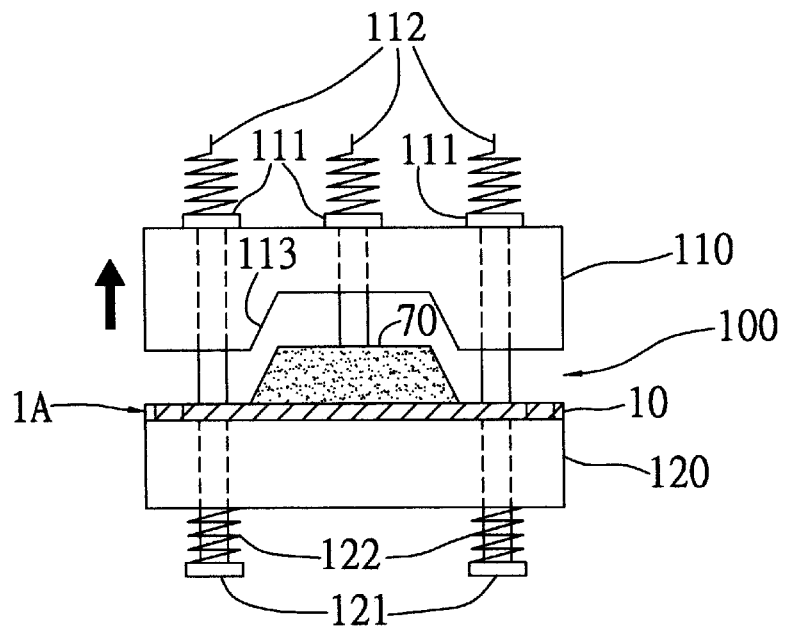
Figure 4D:
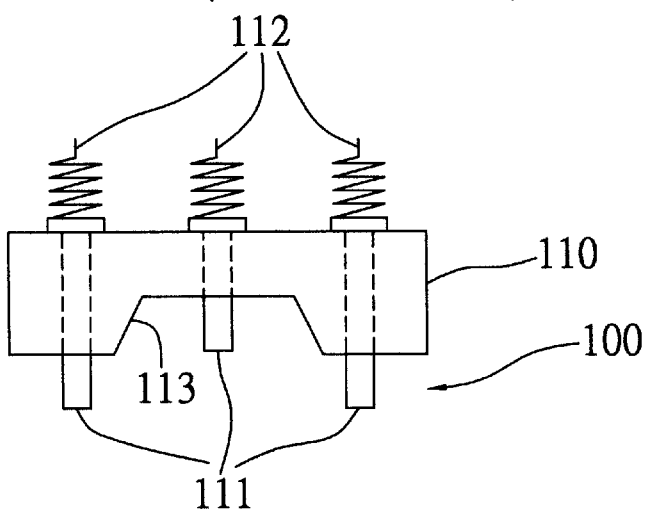
Figure 4D:
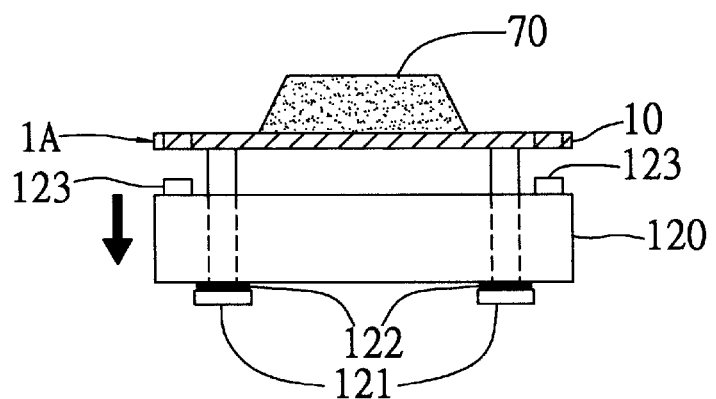
Figure 5:
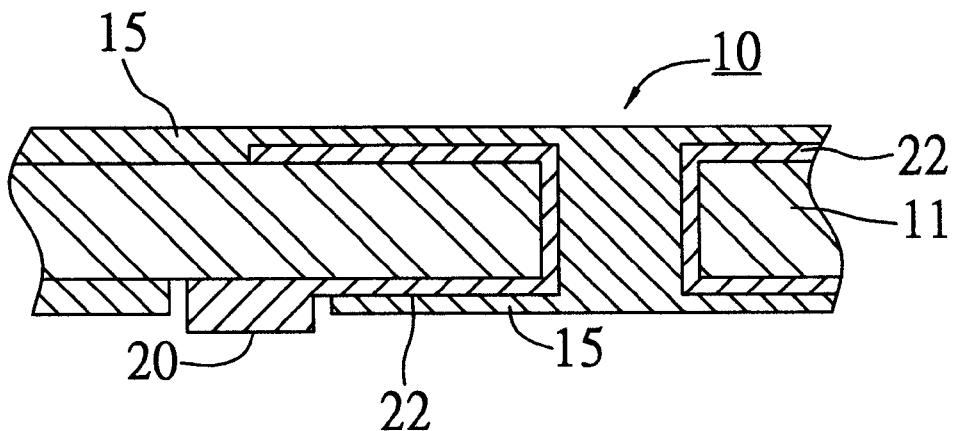
FIG. 5 (PRIOR ART) is a schematic diagram showing the formation of a metallic protrusion exposed to outside of a solder mask layer on a chip carrier for being used as a grounding means.
Figure 6:
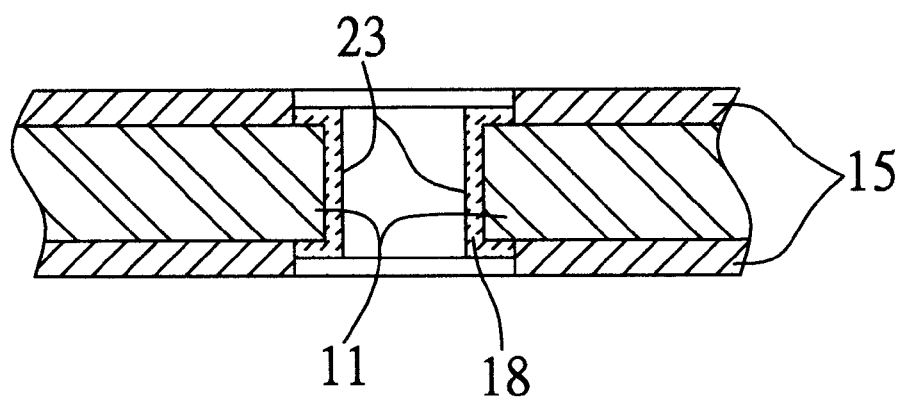
FIG. 6 (PRIOR ART) is a schematic diagram showing the formation of a metal layer on an inside wall of a pilot hole of a chip carrier for being used as a grounding means.
Figure 7:
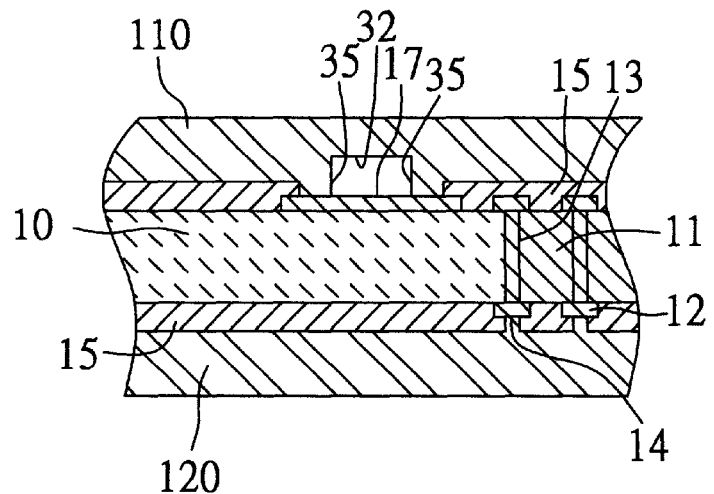
FIG. 7 (PRIOR ART) is a schematic diagram showing the formation of a protrusion on a runner of a mold for being used as a grounding means.

A fabricating method of a semiconductor package proposed in the invention comprises the steps of preparing a chip carrier 10A as the one described above; performing a die bonding pro for mounting at least one semiconductor chip 40 on a first side 101 of the chip carrier 10A; providing a plurality of conductive elements 50 for electrically connecting the semiconductor chip 40 to the chip carrier 10A; performing a molding process for forming an encapsulant 70 for encapsulating the semiconductor chip 40 and the conductive elements 50 on the first side 101 of the chip carrier 10A; performing a de-molding process for ejecting the semi-fabricated semiconductor package respectively from a top mold 110 and a bottom mold 120 of a mold 100 by using the eject pins 111 and 121 on the mold 100 in a manner illustrated in FIGS. 4C an 4D; performing a ball implanting process for implanting a plurality of solder balls 80 at corresponding ball pads 14 on a second side 12 of the chip carrier 10A; and performing a singulating process for forming individual fabricated semiconductor packages.

Figure 3:
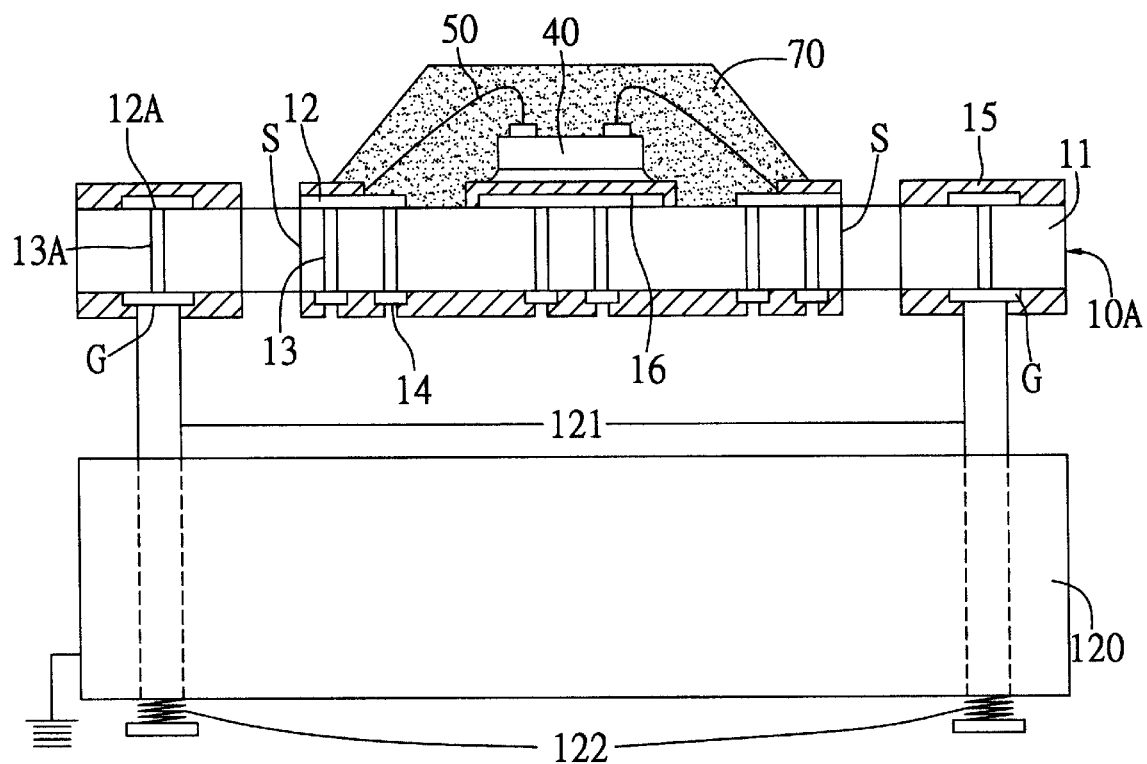
FIG. 3 is a schematic diagram showing the use of eject pins of a mold for ejecting the semiconductor package of the invention in a de-molding process.

Moreover, in the de-molding process, the semi-fabricated semiconductor package is ejected from an engaged surface of the bottom mold 120 in a manner illustrated in FIG. 3 that the eject pins 121 on the bottom mold 120 act on grounding means G formed on the chip carrier 10A. In this case, during molding and de-molding, the grounding means G of the chip carrier 10A allow electrical static produced at a great amount on a surface of the semi-fabricated semiconductor package to be effectively discharged through the mold 100 to outside of the semiconductor package, instead of being retained on the semiconductor chip 40, the conductive elements 50 or the conductive traces. This further prevents electrical leakage or damage to the semiconductor chip 40 from occurrence, and also greatly improves the quality and production efficiency for the semiconductor package.

The grounding means G can also be optionally formed on the first side 101 of the chip carrier 10A corresponding in position to the eject pins 111 of the top mold 110, so as to further eliminate the electric static produced on the semiconductor package during fabrication.

Further, besides a conventional BGA semiconductor package shown in FIG. 8, the chip carrier, the semiconductor package and the fabricating method of the semiconductor package of the invention can also be applied to other types of semiconductor packages, in an effort to prevent the electric static from being retained in the semiconductor package during fabrication.

Moreover, due to no metallic protrusion necessarily formed on the chip carrier 10A, the fabrication accordingly can be simplified in process, and reduced in time expense and cost.

Furthermore, as it is not necessary to form a metal layer on an inside wall of a pilot hole of the chip carrier 10A, the encapsulant can be prevented from being greatly deviated in position and the quality of the semiconductor package can be assured.

In addition, on a runner of the mold 100 there is formed no protrusion, and thus the mold 100 can be repetitively employed for various types of semiconductor packages, so that the fabrication cost can be reduced.

The invention has been described using exemplary preferred embodiments. However, it is to be understood that the scope of the invention is not limited to the disclosed embodiments. On the contrary, it is intended to cover various modifications and similar arrangements, for example, grounding means can be alternatively constructed in other forms such as metallic protrusions, in place of the foregoing plated grounding means G. The scope of the claims, therefore, should be accorded the broadest interpretation so as to encompass all such modifications and similar arrangements.

What is claimed is:

1. A chip carrier, comprising:
   a first side;
   a second side opposing the first side; and
   at least one grounding means formed on the second side corresponding in position to an eject pin of a mold, wherein the mold is coupled to the chip carrier for forming an encapsulant on the chip carrier, and decoupled from the chip carrier such that the grounding means is electrically connected to the eject pin when the mold is removed from the chip carrier for discharging electrical static through the mold.

2. The chip carrier of claim 1, comprising:
   a base layer having a first surface and a second surface opposing the first surface;
   a plurality of conductive traces disposed on the first surface of the base layer and electrically connected to a semiconductor chip;
   a plurality of ball pads formed on the second surface of the base layer for implanting a plurality of solder balls thereon;
   a plurality of vias for electrically connecting the conductive traces to the ball pads respectively;
   a die pad formed on the first surface of the base layer for mounting the semiconductor chip thereon; and
   a solder mask layer deposited on each of the first and second surfaces of the base layer in a manner that part of the conductive traces electrically connected to the semiconductor chip on the first surface and the ball pads on the second surface are respectively exposed to outside of the solder mask layer.

3. The chip carrier of claim 1, wherein the grounding means is formed by plating a conductive material.

4. The chip carrier of claim 3, wherein the conductive material is gold.

5. The chip carrier of claim 2, wherein the grounding means is exposed to the outside of the solder mask layer.

6. The chip carrier of claim 2, wherein the grounding means is electrically connected to a grounding trace disposed on the first side of the chip carrier by a grounding via formed through the base layer.

7. A semiconductor package, comprising:
   a chip carrier having a first side and a second side opposing the first side;
   at least one semiconductor chip mounted on the first side of the chip carrier;
   a plurality of conductive elements for electrically connecting the semiconductor chip to the chip carrier;
   an encapsulant formed of a molding compound for encapsulating the semiconductor chip and the conductive elements on the first side of the chip carrier; and
   a plurality of solder balls implanted on die second side of the chip carrier;
   wherein on one of the sides of the chip carrier there is formed at least one grounding means corresponding in position to an eject pin of a mold which is coupled to the chip carrier for forming the encapsulant, and decoupled from the chip carrier such that the grounding means is electrically connected to the eject pin when the mold is removed from the chip carrier for discharging electrical static through the mold.

8. The semiconductor package of claim 7, wherein the chip carrier further comprises:
   a base layer having a first surface and a second surface opposing the first surface;
   a plurality of conductive traces disposed on the first surface of the base layer and electrically connected to the semiconductor chip;

a plurality of ball pads formed on the second surface of the base layer for implanting the solder balls thereon;

a plurality of vias for electrically connecting the conductive traces to the ball pads respectively;

a die pad formed on the first surface of the base layer for mounting the semiconductor chip thereon; and a solder mask layer deposited on each of the first and second surfaces of the base layer in a manner that part of the conductive traces electrically connected to the semiconductor chip on the first surface and the ball pads on the second surface are respectively exposed to outside of the solder mask layer.

9. The semiconductor package of claim 7, wherein the grounding means is formed by plating a conductive material.

10. The semiconductor package of claim 9, wherein the conductive material is gold.

11. The semiconductor package of claim 8, wherein the grounding means is exposed to the outside of the solder mask layer.

12. The semiconductor package of claim 8, wherein the grounding means is electrically connected to a grounding trace disposed on the first side of the chip carrier by a grounding via formed through the base layer.

13. The chip carrier of claim 1, further comprising:

at least one grounding means formed on the first side of the chip carrier corresponding in position to the eject pin of the mold.

14. The semiconductor package of claim 7, wherein on the side of the chip carrier free of the grounding means there is formed at least one additional grounding means corresponding in position to the eject pin of the mold.

* * * * *